US008646569B2

(12) United States Patent
Yoshida et al.

(10) Patent No.: US 8,646,569 B2
(45) Date of Patent: Feb. 11, 2014

(54) SPEAKER UNIT

(71) Applicant: Yamaha Corporation, Hamamatsu (JP)

(72) Inventors: Masao Yoshida, Hamamatsu (JP); Katsuya Tanaka, Hamamatsu (JP); Tadashi Morikawa, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 13/913,343

(22) Filed: Jun. 7, 2013

(65) Prior Publication Data

US 2013/0327587 A1 Dec. 12, 2013

(30) Foreign Application Priority Data

Jun. 11, 2012 (JP) ................................ 2012-132405

(51) Int. Cl.

*H05K 5/02* (2006.01)
*H04R 1/02* (2006.01)
*F21V 21/04* (2006.01)
*H05K 5/00* (2006.01)
*F21V 21/08* (2006.01)

(52) U.S. Cl.

USPC ............. 181/150; 381/395; 381/87; 248/343; 248/318; 248/320; 362/364; 362/365; 362/368; 362/399

(58) Field of Classification Search

USPC ............ 181/150, 199, 153; 381/386, 395, 87; 248/343, 231.9, 342, 318, 320, 344, 248/322; 362/364, 365, 368, 396, 399, 404, 362/407

See application file for complete search history.

(56) References Cited

U.S. PATENT DOCUMENTS

| | | | | |
|---|---|---|---|---|
| 3,370,125 A | | 2/1968 | Shaw et al. | |
| 3,812,301 A | * | 5/1974 | Lahti | 381/341 |
| 4,082,159 A | * | 4/1978 | Petty | 181/156 |
| 4,162,779 A | * | 7/1979 | Van Steenhoven et al. | 248/343 |
| 4,222,093 A | * | 9/1980 | Garcia et al. | 362/147 |
| 4,286,313 A | * | 8/1981 | Quiogue | 362/370 |
| 4,837,669 A | * | 6/1989 | Tharp et al. | 362/418 |
| 4,967,872 A | * | 11/1990 | Hart | 181/155 |

(Continued)

FOREIGN PATENT DOCUMENTS

JP 2004-120192 A 4/2004

OTHER PUBLICATIONS

Extended European Search Report mailed Oct. 1, 2013, for EP Application No. 13171254.9, four pages.

*Primary Examiner* — Edgardo San Martin
(74) *Attorney, Agent, or Firm* — Morrison & Foerster LLP

(57) ABSTRACT

A mounting ring with which an engaging hook of a fall-preventing member is to be engaged and a flexible handle member are fixed within an area of a cabinet section that is located upward of a first plane passing through the position of a center of gravity of the cabinet section generally in parallel to the bottom surface of the cabinet section and located to one side of a second plane passing through the position of the center of gravity in intersecting relation to the first plane. The speaker unit hung by the handle member being held with a hand of a human operator is inclined, so that the mounting ring is oriented upward near the hand. Thus, the human operator can perform with ease an operation for engaging the engaging hook with the mounting ring with one hand while holding the handle member with the other hand.

6 Claims, 3 Drawing Sheets

(56) References Cited

U.S. PATENT DOCUMENTS

| | | | | |
|---|---|---|---|---|
| 4,999,748 | A * | 3/1991 | Aoshika | 362/147 |
| 5,937,073 | A * | 8/1999 | Van Gieson | 381/391 |
| 5,991,131 | A * | 11/1999 | Othman | 360/137 |
| 5,996,728 | A * | 12/1999 | Stark | 181/144 |
| 6,390,655 | B1 * | 5/2002 | Haugaard et al. | 362/396 |
| 6,561,676 | B1 * | 5/2003 | Fischer et al. | 362/263 |
| 6,609,692 | B1 * | 8/2003 | Muresan et al. | 248/343 |
| 6,619,919 | B2 * | 9/2003 | Kerr, Jr. | 416/5 |
| 6,991,352 | B2 * | 1/2006 | Garber et al. | 362/396 |
| 7,786,379 | B1 * | 8/2010 | Kwong et al. | 174/58 |
| 2001/0043703 | A1 * | 11/2001 | Montanari | 381/87 |
| 2003/0174855 | A1 | 9/2003 | Hawkins et al. | |
| 2007/0000719 | A1 * | 1/2007 | Bothe | 181/150 |

* cited by examiner

SPEAKER UNIT

BACKGROUND

The present invention relates to embedded-type speaker units mounted or installed by being embedded in an opening section formed in a mounting part, such as a ceiling or the like, and more particularly to a speaker unit provided with a structure permitting an enhanced efficiency of speaker unit mounting operation.

There have heretofore been known embedded-type speaker units (such as ceiling speakers) that are installed or mounted by being embedded in a mounting hole (opening section) formed in a ceiling or the like of a room, as disclosed for example in Japanese Patent Application Laid-open Publication No. 2004-120192 (hereinafter referred to as "the relevant patent literature"). Generally, such a speaker unit includes a cabinet section of a substantially cylindrical shape, and a speaker face provided on the bottom surface of the cabinet section. To mount the speaker unit, the cabinet section is inserted into the mounting hole of the ceiling with the speaker face exposed on the face (i.e., lower surface) of the ceiling, and then the inserted cabinet section is fixed or fastened to the ceiling by fastening via bolts or the like. A mounting structure for such a speaker unit includes a fall-preventing structure (i.e., speaker-unit-fall-preventing structure), provided with a fall-preventing member like a chain or wire, for preventing the heavy speaker unit from falling down by mistake before the fastening via the bolts or the like or after cancellation of the fastening.

According to the conventionally-known speaker-unit-fall-preventing structure, before the cabinet section of the speaker unit is inserted into the mounting hole of the ceiling, the fall-preventing member fixed to a beam or the like disposed above the ceiling and extending from the beam is engaged with the speaker unit by being passed through or hooked on a mounting member (engaged member) fixed or fastened to the cabinet section. Then, the speaker unit is inserted into the mounting hole and fixed by means of fastening members, such as bolts. Thus, even in case a human operator erroneously releases its (his or her) hand, supporting the speaker unit, from the speaker unit during a mounting operation, the fall-preventing member (e.g., chain) can prevent the speaker unit from falling down. Similarly, when, in a dismounting operation, the speaker unit is pulled out from the mounting hole of the ceiling after cancellation of the fastening by the fastening members (bolts), the fall-preventing member can prevent the speaker unit from falling down.

However, with the conventionally-known known speaker-unit-fall-preventing structure, the human operator has to perform the operation for engaging the fall-preventing member with the mounting member (engaged member) of the speaker unit with one hand while supporting or holding the speaker unit with the other hand. Because the operation for engaging the fall-preventing member with the mounting member of the speaker unit is performed near the ceiling, the human operator lifts the speaker unit up to the position of the mounting hole of the ceiling while standing on a stepladder. But, because the conventionally-known speaker unit does not have a particular section or component part with which the human operator can hold the speaker unit with the hand, the human operator has to perform the operation for engaging the fall-preventing member with the mounting member of the speaker unit while supporting the heavy speaker unit, for example, on the palm of the hand and keeping balance. Because not only such an operation is extremely difficult to perform but also the human operator cannot hold the speaker unit in a stable state during the operation, the human operator might sometimes drop the speaker unit by mistake.

Furthermore, in the case where the human operator performs the operation for engaging the fall-preventing member with the mounting member of the speaker unit with one hand while holding the speaker unit with the other hand, the human operator has to perform that operation without directly seeing or visually checking the mounting member depending on the way in which the speaker unit is held and the height position at which the speaker unit is held. In such a case, the human operator has to engage the fall-preventing member with the mounting member by touch, which would extremely lower the efficiency of the operation and may result in a mounting error.

SUMMARY OF THE INVENTION

In view of the foregoing prior art problems, it is an object of the present invention to provide an improved embedded-type speaker unit which, when it is to be mounted to an opening section of a mounting part, allows a fall-preventing engaging member to be engaged with an engaged member of the speaker unit with a simple construction and with an increased ease and efficiency.

Note that the same reference numerals and characters as used for various constituent elements of a later-described embodiment of the present invention are indicated in parentheses in the summary below for ease of understanding.

In order to accomplish the above-mentioned object, the present invention provides an improved speaker unit (1) adapted to be mounted to an opening section (61) formed in a mounting part (60), which comprises: a cabinet section (2) adapted to be accommodated in the opening section (61); a speaker face (4) provided on a bottom surface (2*a*) of the cabinet section (2); an engaged member (20) mounted to the cabinet section (2) for engagement with a fall-preventing engaging member (67, 68) extending from within the opening section (61); and a flexible handle member (25) mounted to the cabinet section (2). The engaged member (20) and the handle member (25) are fixed within an area (A) of the cabinet section (2) that is located upward of a first imaginary plane (S1) passing through a position of a center of gravity of the cabinet section (2) generally in parallel to the bottom surface (2*a*) of the cabinet section (2) and that is located to one side of a second imaginary plane (S2) passing through the position of the center of gravity of the cabinet section in intersecting relation to the first imaginary plane (S1).

By the provision of the flexible handle member mounted to the cabinet section, the speaker unit can be held with only one hand of a human operator easily and reliably. Thus, the operation for hookingly engaging the fall-preventing engaging member with the engaged member with one hand while supporting or holding the speaker unit with the other hand can be performed with a greatly increased ease.

Further, because the engaged member and the handle member are fixed within the area of the cabinet section that is located upward of the first imaginary plane and located to one side of the second imaginary plane, they are offset upwardly and to one side (left or right side) from the position of the center of gravity of the cabinet section. Thus, if the human operator lifts the speaker unit by holding the handle member with a hand, the speaker unit is placed in an obliquely hung state with the surface of the cabinet section, having the handle member fixed thereto, oriented upward. Further, because the engaged member and the handle member are fixed within the same area, the engaged member is oriented upward near the hand holding the handle member. Thus, the human operator can easily see the engaged member and easily reach the engaged member with the other hand. Consequently, the human operator can engage the fall-preventing engaging member with the engaged member while visually checking the engaged member, as a result of which the present invention can achieve a significantly enhanced efficiency of the speaker unit mounting operation and reliably prevent occurrence of mistakes during the mounting operation.

Further, because the handle member has flexibility, it can be used for holding the speaker unit with one hand at the time of the speaker unit mounting operation but also can be prevented from interfering with other members by changing its shape as necessary in accordance with a space in the mounted or installed position of the speaker unit. Therefore, the provision of the handle member in the speaker unit of the present invention would not influence the installed position and installed state of the speaker unit. Preferably, the handle member is a flexible, belt-shaped or string-shaped member. Further, the handle member is a pliable member formed of fabric-based material In an embodiment, with the cabinet section (2) held in a hung state via the flexible handle member (25), a surface of the cabinet section (2), having the engaged member (20) mounted thereto, is oriented upward. Thus, with the speaker unit hung by the human operator holding the handle member with a hand, the human operator can see and operate the engaged member with an increased ease and thus can perform, with an even further increased ease, the operation for hookingly engaging the engaging member with the engaged member with one hand while holding the speaker unit with the other hand.

In an embodiment, the handle member (25) is a pliable member fixed at longitudinal opposite end portions thereof to the cabinet section (2), and the engaged member (20) is a ring-shaped mounting member adapted to hookingly engage with the engaging member (68) of a hook shape. Because the handle member is fixed at the longitudinal opposite end portions to the cabinet section, the human operator can hold the speaker unit by hooking its hand or the like on the handle member. Thus, the present invention allows the human operator to easily hold the speaker unit and can reliably reduce the possibility or risk of erroneously dropping the speaker unit. Furthermore, because the handle member is formed of pliable material, the present invention can effectively prevent the handle member from vibrating to cause unwanted vibrating sound (fluttering sound) in response to vibration of the speaker unit due to sound production of the speaker during use of the speaker unit. Further, because the engaged member is a ring-shaped mounting member adapted to hookingly engage with the hook-shaped engaging member, the present invention allows the human operator to perform, with an even further increased ease, the operation for hookingly engaging the engaging member with the engaged member while holding the speaker unit with a hand.

In an embodiment, the cabinet section (2) has a cylindrical shape having an upper surface (2*b*), the bottom surface (2*a*) and an outer peripheral side surface (2*c*) axially interconnecting the upper surface (2*b*) and the bottom surface (2*a*), and the handle member (25) and the engaged member (20) are both fixed to at least one of the outer peripheral side surface (2*c*) and the upper surface (2*b*) of the cabinet section (2).

The present invention is advantageous in that, when the embedded-type speaker unit is to be mounted to the opening section of the mounting part, such as a ceiling, the operation for engaging the fall-preventing engaging member with the engaged member of the speaker unit can be performed with an increased ease and efficiency and with a simplified construction.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

Certain preferred embodiments of the present invention will hereinafter be described in detail, by way of example only, with reference to the accompanying drawings, in which.

DETAILED DESCRIPTION

Figure 1:
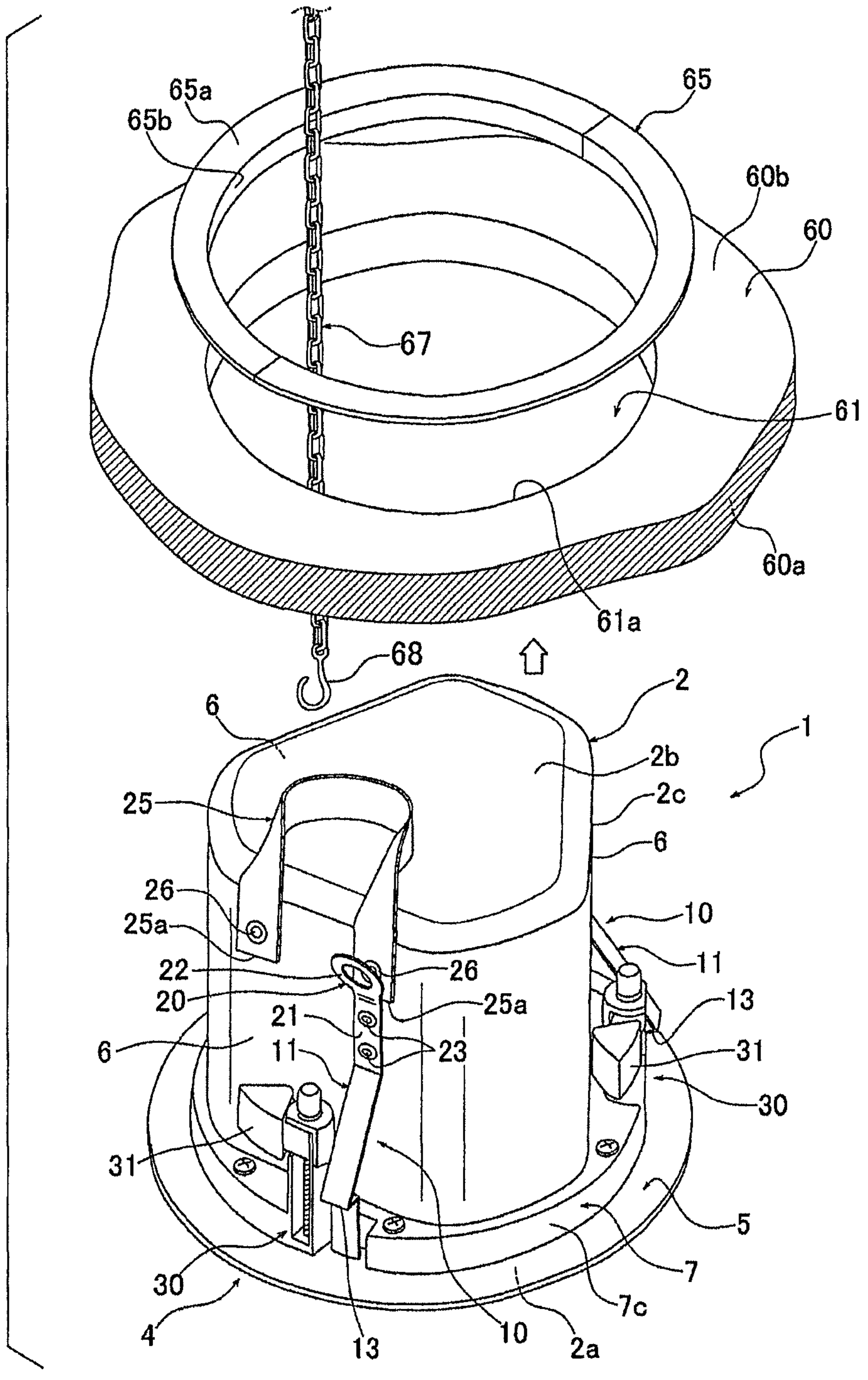
FIG. 1 is a perspective view showing an embodiment of a speaker unit of the present invention and a mounting hole to which the speaker unit is mounted.
Figure 2:
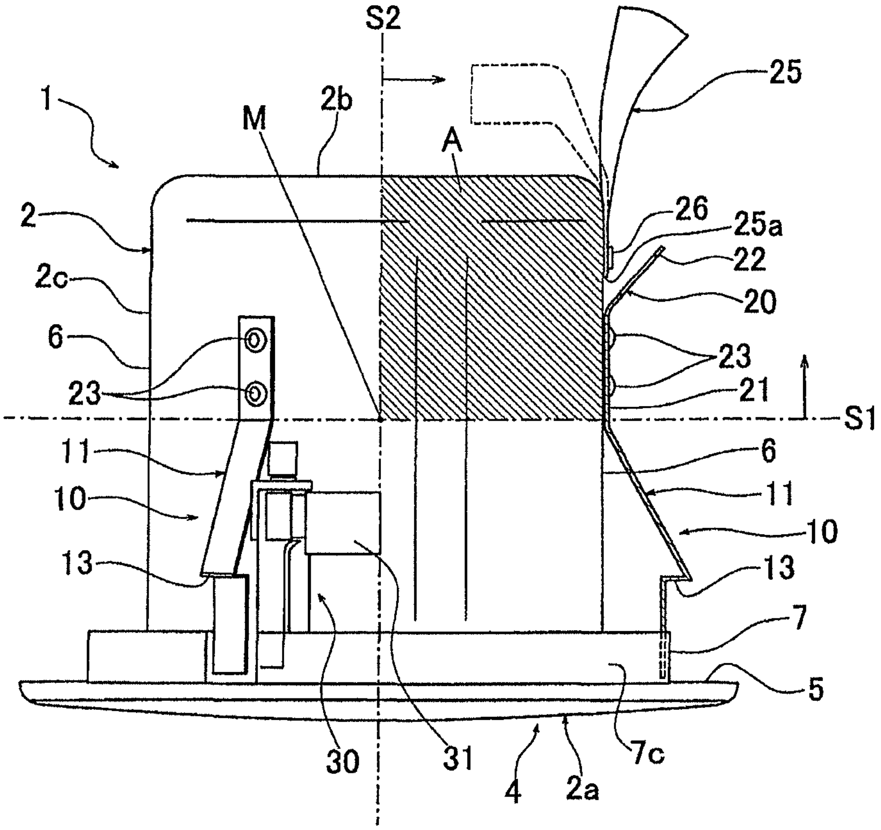
FIG. 2 is a side view of the embodiment of the speaker unit.

The following describe preferred embodiments of the present invention with reference to the accompanying drawings. FIG. 1 is a perspective view showing an embodiment of a speaker unit 1 of the present invention and a mounting hole (opening section) 61 of a ceiling (i.e., mounting part) 60 to which the speaker unit 1 is mounted. FIG. 2 is a side view of the embodiment of the speaker unit 1. As shown in FIG. 1, the speaker unit 1 is an embedded-type speaker unit (or ceiling speaker) installed or mounted by being embedded in the mounting hole (opening section) 61 formed in the ceiling (mounting part) 60 of a room.

The mounting hole 61 of the ceiling 60 shown in FIG. 1 is a circular through-hole formed through the ceiling 60 from the face side surface (i.e., lower side surface) 60*a* to the reverse side surface (i.e., upper side surface) 60*b* of the ceiling 60. A mounting hardware member 65, which is an annular, thin plate-shaped member, is provided on and along the inner peripheral edge portion 61*a* of the mounting hole 61. The mounting hardware member 65, which has a generally L sectional shape, has an upper wall 65*a* placed on the upper surface of the inner peripheral edge portion 61*a* of the mounting hole 61 and a peripheral side wall 65*b* placed on the inner peripheral surface of the inner peripheral edge portion 61*a* of the mounting hole 61. The mounting hardware member 65 is mounted by being placed on the reverse side surface 60*b* around the inner peripheral edge portion 61*a* of the mounting hole 61. Note that, in the following description, the term "inner peripheral edge portion 61*a* of the mounting hole 61" is used to refer to the inner peripheral edge portion of the mounting hole 61 with the mounting hardware member 65 mounted thereon.

Further, a fall-preventing member (engaging member) 67, such as a chain, fixed to a beam or the like disposed above the ceiling 60 is hung down in the mounting hole 61. An engaging hook (engaging member) 68 to be hookingly engaged with the speaker unit 1 is provided at the distal end (lower end) of the fall-preventing member 67. Note that the fall-preventing member 67 may be other than a chain, such as a wire, as long as it can hang and support the speaker unit 1.

The speaker unit 1 includes a cabinet section 2 accommodatable in the mounting hole 61 of the ceiling 60. The cabinet section 2 has a cylindrical shape having an upper surface 2*b*, a bottom surface (lower surface) 2*c* and an outer peripheral side surface 2*c* axially interconnecting the upper surface 2*b* and the bottom surface (lower surface) 2*a*, and a speaker face (i.e., speaker's sounding front surface) 4 is provided on the bottom surface 2*a* of the cabinet section 2. Further, in the following description, terms "upper" and "lower" are used to refer to an axial direction (up-down direction in FIGS. 1 and 2) of the cylindrical cabinet section 2. A bottom cover 7 is provided to surround the bottom surface 2*a* of the cabinet section 2 and the outer periphery of the cabinet section 2 adjoining the bottom surface 2*a*. The bottom cover 7 is an annular or ring-shaped member covering the bottom surface 2*a* of the cabinet section 2 and a part of the outer periphery of the cabinet section 2 immediately above the bottom surface 2*a*, and the outer peripheral surface (outer peripheral edge) 7*c* of the cover 7 has a diameter greater than an outer diameter of the upper surface 2*b* of the cabinet section 2. Thus, the bottom cover 7 is formed as an annular or ring-shaped protrusion projecting radially outward (i.e., outward in a radial direction from the central axis of the cabinet section 2) from the bottom surface 2*a* and the part of the outer periphery of the cabinet section 2 adjoining the bottom surface 2*a*. In the instant embodiment, the bottom cover 7 is a member formed of synthetic resin, and the cabinet section 2 located upwardly of the bottom cover 7 is formed of metal.

Further, a thin plate-shaped flange portion 5 projecting radially outward is formed on the lower-end outer periphery of the bottom cover 7. More specifically, the flange portion 5 is formed as a ring-shaped edge portion formed integrally with the bottom cover 7 to extend radially outward at generally the same height position as the bottom surface 2*a* of the cabinet section 2 (speaker face 4).

The speaker unit 1 further includes a provisionally fastening mechanism 10 for provisionally fastening to the ceiling 60 the speaker unit 1 with the cabinet section 2 inserted through the mounting hole 61. The provisionally fastening mechanism 10 includes a provisionally fastening tab (provisionally fastening member) 11 fixed at one end portion to the outer peripheral side surface 2*c* of the cabinet section 2. The provisionally fastening tab 11, which is in the form of a thin plate of resilient metal, integrally has a stepped engaging section 13 engageable with the inner peripheral edge portion 61*a* of the mounting hole 61 on the reverse side of the ceiling 60. Such provisionally fastening tabs 11 are provided at three positions along the peripheral direction of the cabinet section 2.

Further, as shown in FIGS. 1 and 2, the speaker unit 1 includes a stopper mechanism 30 for fully fixing or fastening the speaker unit 1 provisionally fastened in the mounting hole 61 by means of the above-mentioned provisionally fastening mechanism 10. The stopper mechanism 30 includes a stopper piece (fixation member) 31 provided for movement in a vertical or up-down direction alongside of the cabinet section 2, so that the stopper mechanism 30 can fasten the speaker unit 1 by sandwiching the inner peripheral edge portion 61*a* of the mounting hole 61 between the flange portion 5 and the stopper piece (fixation member) 31. Such stopper mechanisms 30 are provided at three positions along the peripheral direction of the cabinet section 2. Because the mechanisms for provisionally fastening the speaker unit 1 and fully fastening the speaker unit 1 do not constitute features of the present invention, detailed descriptions about the provisionally fastening mechanism 10 and stopper mechanism 30 are omitted here. Note that the provisionally fastening mechanism 10 may be dispensed with. Further, the stopper mechanism 30 is just one example of the mechanism for fully fastening the speaker unit 1, and any other suitable mechanisms, such as a fixation mechanism based on fastening by bolts, may be employed as the mechanism for fully fastening the speaker unit 1.

The speaker unit 1 also includes a mounting ring (engaged member) 20 provided on the outer peripheral side surface 2*c* of the cabinet section 2. The mounting ring 20 is a thin plate-shaped member formed of metal for hookingly engaging with the engaging hook 68 of the fall-preventing member 67. The mounting ring 20 includes a fixation section 21 fixed to the outer peripheral side surface 2*c* of the cabinet section 2 by means of rivets 23, and an annular ring section 22 formed integrally with one end (upper end) of the fixation section 21. The ring section 22 extends obliquely upward in such a manner that it gradually gets away from the outer peripheral side surface 2*c* of the cabinet section 2 as its distance from the fixation section 21 increases. Note that, in the instant embodiment, the mounting ring 20 is formed integrally with the provisionally fastening tab 11. Namely, the provisionally fastening tab 11 is formed integrally with one end (lower end) of the fixation section 21, and the ring section 22 of the mounting ring 20 is formed integrally with the other end (upper end) of the fixation section 21. Alternatively, the mounting ring 20 may be provided as a separate member from the provisionally fastening tab 11, although not particularly shown.

Further, the speaker unit 1 includes a handle member 25 mounted to the outer peripheral side surface 2*c* of the cabinet section 2. The handle member 25 is a belt-shaped member having flexibility and pliability for a user or human operator to hold and hang the speaker unit 1 with its hand. More specifically, the handle member 25 is in the form of fabric made by kitting fibers of synthetic resin, such as polyamide resin, into a belt shape. The handle member 25 is fixed at its opposite longitudinal end portions 25*a* to the outer peripheral side surface 2*c* of the cabinet section 2 by means of a pair of rivets 26 in such a manner that the handle member 25 has a U-shape loop portion between the opposite end portions 25*a*. The human operator can hold and hang the speaker unit 1 by hooking its (his or her) hand finger or the like on the U-shape loop portion of the handle member 25. Further, because of the flexibility and pliability, the handle member 25 is changeable in shape in conformity with the contour of the cabinet 2 as one or more other members around the handle member 25 abut against the handle member 25, except when the speaker unit 1 is being held by the human operator. Therefore, the handle member 25 does not interfere with the other members around the handle member 25 during or after installation of the speaker unit 1.

As also shown in FIG. 1, the cabinet section 2 of the speaker unit 1 has, as viewed in top plan, a generally triangular cylindrical shape of which the outer peripheral side surface 2*c* comprises three flat outer peripheral surfaces 6 that are oriented in three different directions at equal angular intervals about the central axis of the cylindrical cabinet section 2; thus, the cabinet section 2 is generally in the form of a triangular column. Further, the above-mentioned mounting ring 20 and the handle member 25 are both fixed to a same one of the flat outer peripheral surfaces 6. Namely, the mounting ring 20 and the handle member 25 are fixed to one of the flat outer peripheral surfaces 6 that is oriented in one of the three directions.

Further, as shown in FIG. 2, the mounting ring 20 and the handle member 25 are fixed within an area (i.e., hatched area in FIG. 2) A of the flat outer peripheral surfaces 6 that is located upward of a first plane (imaginary plane) S1 passing through the position of the center of gravity M of the cabinet section 2 generally in parallel to the bottom surface 2*a* and that is located to one side (right side in FIG. 2) of a second plane (imaginary plane) S2 passing through the position of the center of gravity M of the cabinet section 2 in intersecting relation to the first plane S1.

The following describe an operational sequence for installing or mounting the speaker unit 1 of the aforementioned construction in the mounting hole 61 of the ceiling 60. For the mounting of the speaker unit 1 in the mounting hole 61 of the ceiling 60, the mounting hardware member 65 is installed in advance on the inner peripheral edge portion 61*a* of the mounting hole 61 of the ceiling 60 as shown in FIG. 1.

Figure 3A:
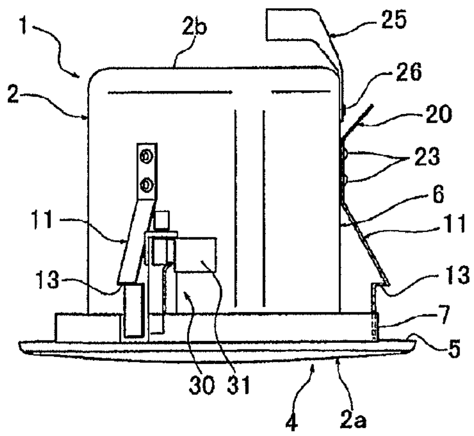
FIGS. 3A to 3C are views explanatory of an operational sequence for hookingly engaging an engaging hook of a fall-preventing member with a mounting ring of the speaker unit.
Figure 3B:
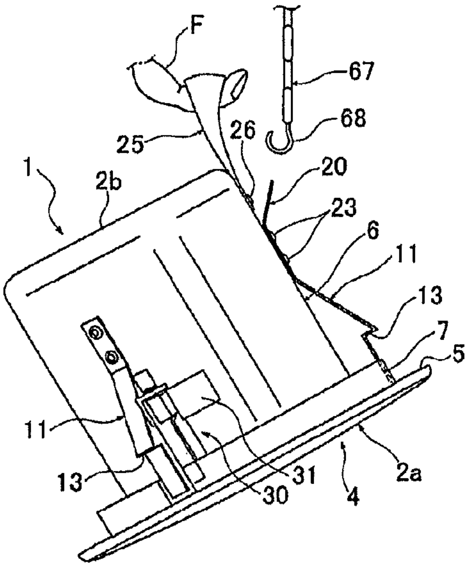
Figure 3C:
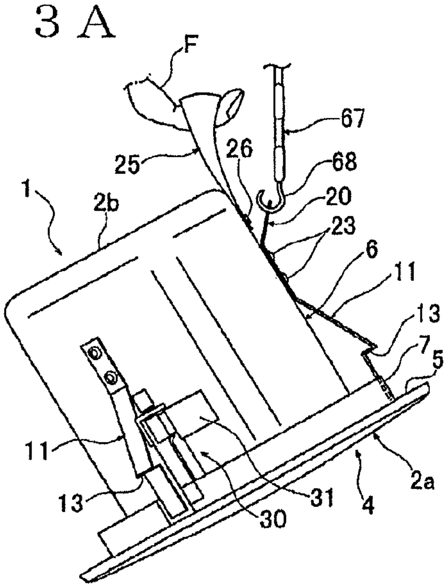

Then, the engaging hook 68 of the fall-preventing member (chain) 67 hanging down in the mounting hole 61 is hookingly engaged with the mounting ring 20 of the speaker unit 1. FIGS. 3A to 3C are views explanatory of an operational sequence for hookingly engaging the engaging hook 68 of the fall-preventing member 67 with the mounting ring 20 of the speaker unit 1. For this purpose, the human operator hooks its (his or her) hand finger or the like on the handle member 25 of the speaker unit 1 shown in FIG. 3A and lifts the handle member 25 so that the speaker unit 1 is hung by the handle member 25. Because the fixed position of the handle member 25 is laterally offset from the center of gravity M (central axis of the cabinet section 2) of the speaker unit 1, the speaker unit 1 is hung in an inclined fashion with the flat outer peripheral surface 6, having the handle member 25 fixed thereto, oriented obliquely upward. Thus, the mounting ring 20 fixed to the flat outer peripheral surface 6 is oriented obliquely upward near the hand (finger) F holding the handle member 25.

In the aforementioned state, the human operator holds the engaging hook 68 of the fall-preventing member 67 with the other hand and hookingly engages the engaging hook 68 with the mounting ring 20. Thus, the fall-preventing member 67 is engaged with the mounting ring 20 of the speaker unit 1. Therefore, even when the human operator releases the hand, holding the handle member 25, from the handle member 25, the speaker unit 1 can be prevented from falling down, by being hung via the fall-preventing member 67.

In the aforementioned state, the human operator shifts the hand, holding the handle member 25, to support the underside (bottom surface side) of the speaker unit 1, inserts, from the face side of the ceiling 60, the cabinet section 2 into the mounting hole 61 and then gradually pushes the cabinet section 2 upward in the mounting hole 61. As the cabinet section 2 moves upward in the mounting hole 61 like this, the stepped engaging section 13 engages with the inner peripheral edge portion 61*a* of the mounting hole 61, so that the speaker unit 1 is placed in a provisionally fastened state in the mounting hole 61. Therefore, even when the human operator does not support the speaker unit 1, the speaker unit 1 can be prevented from falling down from the mounting hole 61.

With the speaker unit 1 held in the above-mentioned provisionally fastened state, the speaker unit 1 is fully fastened via the stopper mechanism 30. For fully fastening the speaker unit 1, the human operator rotates not-shown fastening screws from the bottom surface (2*a*) side of the speaker unit 1 by means of a tool, such as a screw driver, to move the stopper piece (fixation member) 31 of the stopper mechanism 30 and thereby causes the inner peripheral edge portion 61*a* of the mounting hole 61 to be sandwiched between the stopper piece 31 and the flange portion 5. In this way, the speaker unit 1 is fully fastened in the mounting hole 61.

Because the embodiment of the speaker unit 1 include the flexible belt-shaped handle member 25 mounted to the outer peripheral side surface 2*c* of the cabinet section 2 as noted above, it can be held by the human operator with only one hand easily and reliably. Thus, the operation for hookingly engaging the engaging hook 68 of the fall-preventing member 67 with the mounting ring 20 with one hand while supporting or holding the speaker unit 1 with the other hand can be performed with a greatly increased ease.

Further, as set forth above, the mounting ring 20 and the handle member 25 are fixed within the area A of the cabinet section 2 that is located upward of the first plane S1 passing through the position of the center of gravity M of the cabinet section 2 generally in parallel to the bottom surface 2*a* and that is located to one side of the second plane S2 passing through the position of the center of gravity M of the cabinet section 2 in intersecting relation to the first plane S1. Namely, the mounting ring 20 and the handle member 25 are offset upwardly and to one side (left or right side) from the position of the center of gravity M of the cabinet section 2. Thus, if the human operator lifts the speaker unit 1 by holding the handle member 25 with a hand, the speaker unit 1 is placed in an obliquely hung state with the flat outer peripheral surface 6, having the handle member 25 fixed thereto, oriented upward. Thus, the mounting ring 20 fixed to the same flat outer peripheral surface 6 as the handle member 25 is oriented obliquely upward near the hand holding the handle member 25. Because the mounting ring 20 is within easy reach of the human operator holding the handle member 25 of the speaker unit 1, the human operator can easily see and reach the mounting ring 20. Consequently, the human operator can engage the engaging hook 68 with the mounting ring 20 while visually checking the mounting ring 20, as a result of which the instant embodiment can achieve a significantly enhanced efficiency of the operation for mounting the fall-preventing member (chain) 67 and prevent occurrence of mistakes during the mounting operation.

Further, because the handle member 25 is a belt-shaped member having flexibility and pliability, it can be used by the user for holding the speaker unit 1 with one hand at the time of the mounting or installing operation of the speaker unit 1 but also can be prevented from interfering with other members by changing its shape as necessary in accordance with a space in the installed position of the speaker unit 1. Therefore, the provision of the handle member 25 would not influence the installed position and installed state of the speaker unit 1.

Further, according to the embodiment of the speaker unit 1, the flat outer peripheral surface 6 (outer peripheral side surface 2*c*), having the mounting ring 20 fixed thereto, is oriented upward when the cabinet section 2 is hung by the human operator holding the handle member 25. Thus, with the speaker unit 1 hung by the human operator holding the handle member 25 with a hand, the human operator can see and operate the mounting ring 20 with an increased ease and thus can perform, with a greatly increased ease, the operation for hookingly engaging the engaging hook 68 with the mounting ring 20 with one hand while holding the speaker unit 1 with the other hand.

Further, because the handle member 25 has a U-shape loop portion between its longitudinal opposite end portions 25*a* fixed to the flat outer peripheral surface 6, the human operator can hold the speaker unit 1 by hooking its hand or the like on the U-shape loop portion of the handle member 25. Thus, the instant embodiment allows the human operator to easily hold the speaker unit 1 in a hung-by-hand fashion and can reliably reduce the possibility of erroneously dropping the speaker unit 1. Furthermore, because the handle member 25 is formed of pliable material (e.g., fabric-based material), the instant embodiment can effectively prevent the handle member 25 from vibrating to cause vibrating sound (fluttering sound) in response to vibration of the speaker unit 1 due to sound production of the speaker during use of the speaker unit 1.

It should be appreciated that the present invention is not limited to the above-described preferred embodiment and can be modified variously within the scope of appended claims and within the scope of the technical idea disclosed in the specification and drawings. For example, as long as the mounting ring 20 and the handle member 25 are fixed within the area A of the cabinet section 2 that is located upward of the first plane S1 passing through the position of the center of gravity M of the cabinet section 2 generally in parallel to the bottom surface 2*a* and that is located to one side of the second plane S2 passing through the position of the center of gravity M of the cabinet section 2 in intersecting relation to the first plane S1, the mounting ring 20 and the handle member 25 may be fixed to the upper surface 2*b* or fixed across portions of both the outer peripheral side surface 2*c* and the upper surface 2*a* rather than fixed to the outer peripheral side surface 2*c* as set forth above. Namely, it is only necessary that the mounting ring 20 and the handle member 25 be located upward and to the left or right of the position of the center of gravity M in such a manner that, with the speaker unit 1 hung by the handle member 25 being held with one hand, the cabinet section 2 is placed in an inclined position due to the eccentricity of the position of the center of gravity thereof and the section having the mounting ring 20 and the handle member 25 mounted thereto is oriented upward. In other words, it is only necessary that the human operator holding the handle member 25 with one hand be able to see the mounting ring 20 and easily reach the mounting ring 20 with the other hand.

Further, the cabinet section 2 is not limited to the cylindrical shape having the upper surface 2*b*, bottom surface 2*a* and outer peripheral side surface 2*c* and may be of any other desired shape as long as it has the bottom surface. Thus, for example, a portion of the cabinet section 2 located upward of the bottom surface may be formed in a semispherical shape or polygonal cylindrical shape, such as a cubic shape. In such a case too, it is only necessary that the engaged member and the handle member employed in the present invention be fixed within an area of the cabinet section 2 that is located upward of the first plane passing through the position of the center of gravity of the cabinet section 2 generally in parallel to the bottom surface of the cabinet section 2 and that is located to one side of the second plane passing through the position of the center of gravity of the cabinet section in intersecting relation to the first plane.

Furthermore, the handle member 25 may be of other than the belt shape, such as a string shape, and the handle member 25 may be fixed at only one end portion rather than the opposite end portions. Besides, as long as the handle member 25 is a pliable (soft) member having a similar degree of pliability as fabric, the material of the handle member 25 is not limited to synthetic resin, and it may be a belt-shaped or string-shaped member formed of fibers other than synthetic resin fibers.

Furthermore, whereas the embodiment of the speaker unit 1 has been described above as a type that has various component parts, such as a screw driver, incorporated therein, the speaker unit 1 of the present invention may be of a type that does not have all of the various component parts incorporated therein or does not have any one of the various component parts incorporated therein, as long as it includes the cabinet section to be embedded in and mounted to an opening section of a ceiling or the like. Namely, only a boxed cabinet section may be mounted to a ceiling or the like by use of the aforementioned engaging members and engaged member of the present invention, and then necessary component parts may be accommodated in the mounted cabinet section.

This application is based on, and claims priority to, Japanese Patent Application No. 2012-132405 filed on 11 Jun. 2012. The disclosure of the priority application, in its entirety, including the drawings, claims, and the specification thereof, are incorporated herein by reference.

What is claimed is:

1. A speaker unit adapted to be mounted to an opening section formed in a mounting part, comprising:

a cabinet section adapted to be accommodated in the opening section;

a speaker face provided on a bottom surface of said cabinet section;

an engaged member mounted to said cabinet section for engagement with a fall-preventing engaging member extending from within the opening section; and a flexible handle member mounted to said cabinet section, wherein said engaged member and said handle member are fixed within an area of said cabinet section that is located upward of a first imaginary plane passing through a position of a center of gravity of said cabinet section generally in parallel to the bottom surface of said cabinet section and that is located to one side of a second imaginary plane passing through the position of the center of gravity of said cabinet section in intersecting relation to the first imaginary plane.

2. The speaker unit as claimed in claim 1, wherein said handle member is a flexible, belt-shaped or string-shaped member.

3. The speaker unit as claimed in claim 1, wherein, with said cabinet section held in a hung state via said flexible handle member, a surface of said cabinet section, having said engaged member mounted thereto, is oriented upward.

4. The speaker unit as claimed in claim 1, wherein said handle member is a pliable member fixed at longitudinal opposite end portions thereof to said cabinet section, and said engaged member is a ring-shaped mounting member adapted to hookingly engage with the engaging member of a hook shape.

5. The speaker unit as claimed in claim 1, wherein said cabinet section has a cylindrical shape having an upper surface, the bottom surface and an outer peripheral side surface axially interconnecting the upper surface and the bottom surface, and said handle member and said engaged member are both fixed to at least one of the outer peripheral side surface and the upper surface of said cabinet section.

6. The speaker unit as claimed in claim 1, wherein said handle member is a pliable member formed of fabric-based material.

* * * * *